United States Patent
Caplinger

(10) Patent No.: US 10,976,380 B2
(45) Date of Patent: Apr. 13, 2021

(54) SYSTEM AND METHOD FOR MAGNETOMETER MONITORING

(71) Applicant: Rockwell Collins, Inc., Cedar Rapids, IA (US)

(72) Inventor: Robert M. Caplinger, Lenexa, KS (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 42 days.

(21) Appl. No.: 16/251,370

(22) Filed: Jan. 18, 2019

(65) Prior Publication Data
US 2020/0233043 A1    Jul. 23, 2020

(51) Int. Cl.
| G01R 33/00 | (2006.01) |
| G01C 21/18 | (2006.01) |
| G01C 21/20 | (2006.01) |
| G01R 33/02 | (2006.01) |
| G01C 23/00 | (2006.01) |

(52) U.S. Cl.
CPC ......... *G01R 33/0035* (2013.01); *G01C 21/18* (2013.01); *G01C 21/20* (2013.01); *G01R 33/0029* (2013.01); *G01R 33/0041* (2013.01); *G01R 33/0206* (2013.01); *G01C 23/005* (2013.01)

(58) Field of Classification Search
CPC ............ G01R 33/0035; G01R 33/0029; G01R 33/0041; G01R 33/0206; G01C 21/18; G01C 21/20; G01C 23/005
See application file for complete search history.

(56) References Cited

U.S. PATENT DOCUMENTS

| 3,521,229 | A | * | 7/1970 | Delprat | ..................... G01S 1/02 340/967 |
| 2011/0106345 | A1 | * | 5/2011 | Takacs | ................... G08G 5/025 701/17 |
| 2016/0334219 | A1 | * | 11/2016 | Askarpour | ............. G01C 21/18 |
| 2017/0045895 | A1 | * | 2/2017 | Wang | .................. G06K 9/0063 |
| 2018/0088147 | A1 | * | 3/2018 | Askarpour | ............. G01P 21/00 |

* cited by examiner

*Primary Examiner* — Hunter B Lonsberry
*Assistant Examiner* — Matthew J. Reda
(74) *Attorney, Agent, or Firm* — Suiter Swantz pc llo

(57) ABSTRACT

A system for determining a heading of a vehicle is disclosed. The system includes a magnetometer configured to generate a magnetic heading output signal, and one or more rate gyros configured to generate a gyro angular rate output signal. The system may further include a controller configured to determine a magnetometer heading rate based on the magnetic heading output signal and a gyro heading rate based on the gyro angular rate output signal. The controller may calculate a difference value between the magnetometer heading rate and the gyro heading rate. If the difference value is above a difference threshold value, the controller may calculate an integration value between the magnetometer heading rate and the gyro heading rate, report a positive magnetometer error state if the integration value is above an integration threshold value, and report a negative magnetometer error state if the integration value is below the integration threshold value.

16 Claims, 3 Drawing Sheets

SYSTEM AND METHOD FOR MAGNETOMETER MONITORING

BACKGROUND

Vehicle navigation systems often calculate the heading of the vehicle based on a number of heading readings, including magnetic headings determined by a magnetometer, and heading rates determined by rate gyros. Calculating a heading of the vehicle based on data received from multiple sources (e.g., magnetometers, rate gyros, gyrocompasses, and the like) may improve the accuracy and reliability of a navigation system. However, exterior or induced magnetic fields may cause magnetometers to exhibit a certain degree of error. Accordingly, magnetometers are sensitive to disturbances from objects which may affect magnetic fields, such as rebar in a runway and other ferrous objects. These magnetometer disturbances and heading errors may be problematic to aircraft in a landing phase of a flight, especially during decrab and roll-out landing procedures. These problems are magnified in the case of autonomous vehicles. During these landing phases, heading accuracy is extremely important to prevent side load on the landing gear, and to maintain the runway centerline during roll-out. Therefore, it would be desirable to provide a system and method that cure one or more of the issues identified above.

SUMMARY

In one aspect, embodiments of the inventive concepts disclosed herein are directed to a system for determining a heading of a vehicle. In embodiments, the system includes a magnetometer configured to determine a magnetic heading of a vehicle and generate a magnetic heading output signal. The system further includes one or more rate gyros configured to generate a gyro angular rate output signal. The system further includes a controller configured to: determine a magnetometer heading rate over a time interval based on the magnetic heading output signal; determine a gyro heading rate over the time interval based on the gyro angular rate output signal; calculate a difference value between the magnetometer heading rate and the gyro heading rate over the time interval and compare the difference value to a difference threshold value; calculate an integration value between the magnetometer heading rate and the gyro heading rate over the time interval if the difference value is above the difference threshold value; report a positive magnetometer error state if the integration value is greater than an integration threshold value, and report a negative magnetometer error state if the integration value is lower than the integration threshold value.

In another aspect, embodiments of the inventive concepts disclosed herein are directed to a vehicle system. In embodiments, the vehicle system may include a controller configured to determine a magnetometer heading rate of the aircraft based on a magnetic heading of the aircraft; determine a gyro heading rate of the aircraft based on a gyro heading of the aircraft; calculate a difference value between the magnetometer heading rate and the gyro heading rate and compare the difference value to a difference threshold value; calculate an integration value between the magnetometer heading rate and the gyro heading rate if the difference value is above the difference threshold value; report a positive magnetometer error state if the integration value is greater than an integration threshold value, and report a negative magnetometer error state if the integration value is lower than the integration threshold value.

In another aspect, embodiments of the inventive concepts disclosed herein are directed to a method for determining a heading of a vehicle. The method may include determining a magnetometer heading rate of a vehicle based on a magnetic heading of the vehicle, and determining a gyro heading rate of the vehicle based on a gyro heading of the vehicle. The method may further include calculating a difference value between the magnetometer heading rate and the gyro heading rate, and comparing the difference value to a difference threshold value. The method may further include calculating an integration value between the magnetometer heading rate and the gyro heading rate if the difference value is above the difference threshold value. The method may further include reporting a positive magnetometer error state if the integration value is greater than an integration threshold value, and reporting a negative magnetometer error state if the integration value is lower than the integration threshold value.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Figure 1:
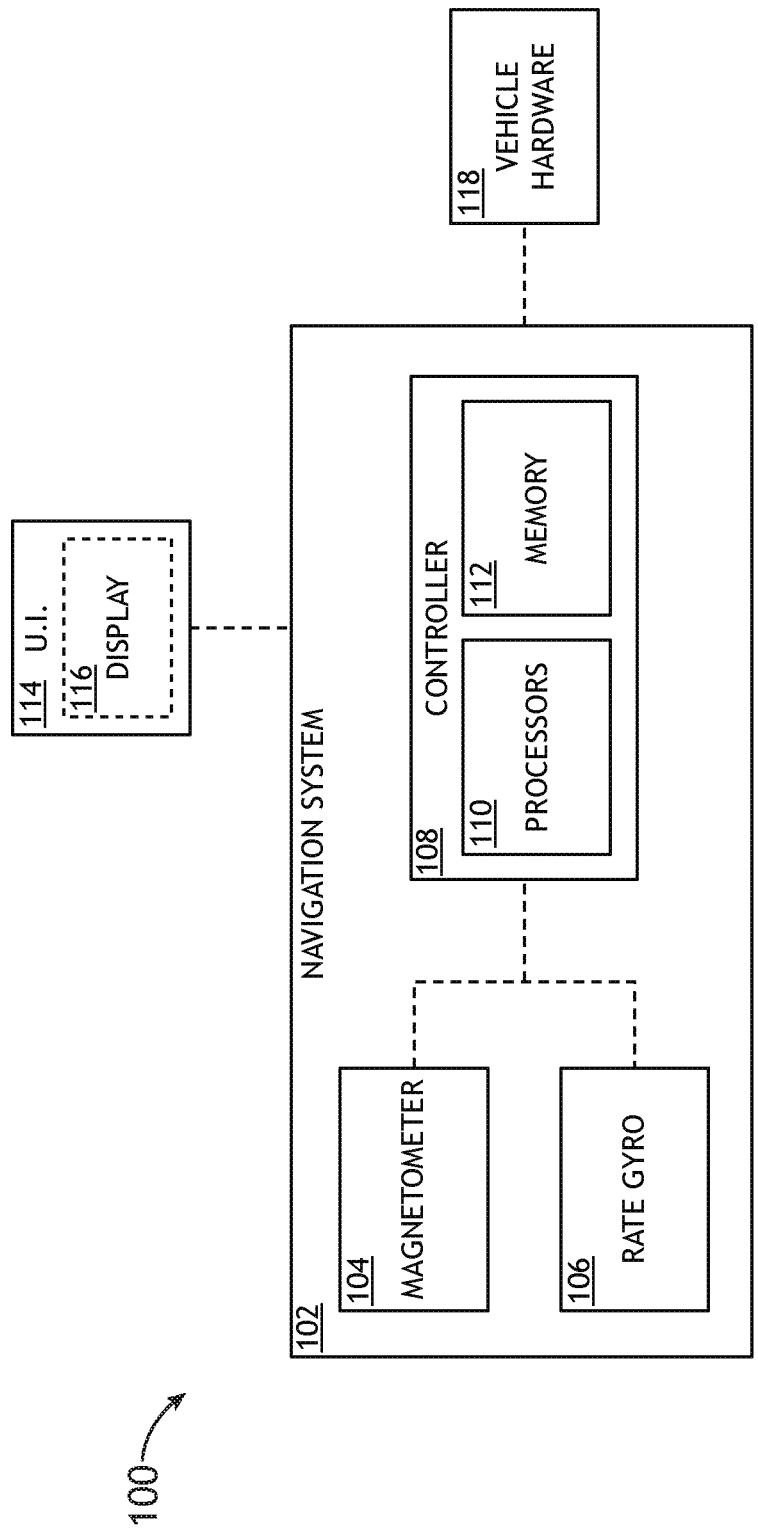
FIG. 1 illustrates a system for determining the heading of a vehicle, in accordance with an example embodiment of the present disclosure.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

Additionally, as used herein, a letter following a reference numeral is intended to reference an embodiment of the feature or element that may be similar, but not necessarily identical, to a previously described element or feature bearing the same reference numeral (e.g., 1, 1A, 1B). Such shorthand notations are used for purposes of convenience only, and should not be construed to limit the inventive concepts disclosed herein in any way unless expressly stated to the contrary.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a system and method for monitoring magnetometer heading readings of a vehicle.

Vehicle navigation systems often calculate the heading of the vehicle based on a number of heading readings, including magnetic headings determined by a magnetometer, and gyro heading rates (e.g., angular rates) determined by one or more rate gyros. Calculating a heading of the vehicle based on data received from multiple sources (e.g., magnetometers, rate gyros, gyrocompasses, and the like) may improve the accuracy and reliability of a navigation system. However, exterior or induced magnetic fields may cause magnetometers to exhibit a certain degree of error. Accordingly, magnetometers are sensitive to disturbances objects which may affect magnetic fields, such as rebar in a runway and other ferrous objects.

Magnetometer disturbances and heading errors may be problematic to aircraft in a landing phase of a flight, especially during decrab and roll-out landing procedures. These problems are magnified in the case of autonomous vehicles. During these landing phases, heading accuracy is extremely important to prevent side load on the landing gear, and to maintain the runway centerline during roll-out.

Accordingly, embodiments of the present disclosure are directed to a system and method for monitoring potential magnetometer heading errors. Additional embodiments of the present disclosure are directed to determining a magnetometer error state, and excluding magnetometer heading readings from vehicle heading calculations while the magnetometer is in an error state in order to improve vehicle heading calculations without increasing the size, weight, or complexity of aircraft hardware. Further embodiments of the present disclosure are directed to adjusting one or more characteristics of vehicle hardware in response to a determined heading of the vehicle.

Figure 2:
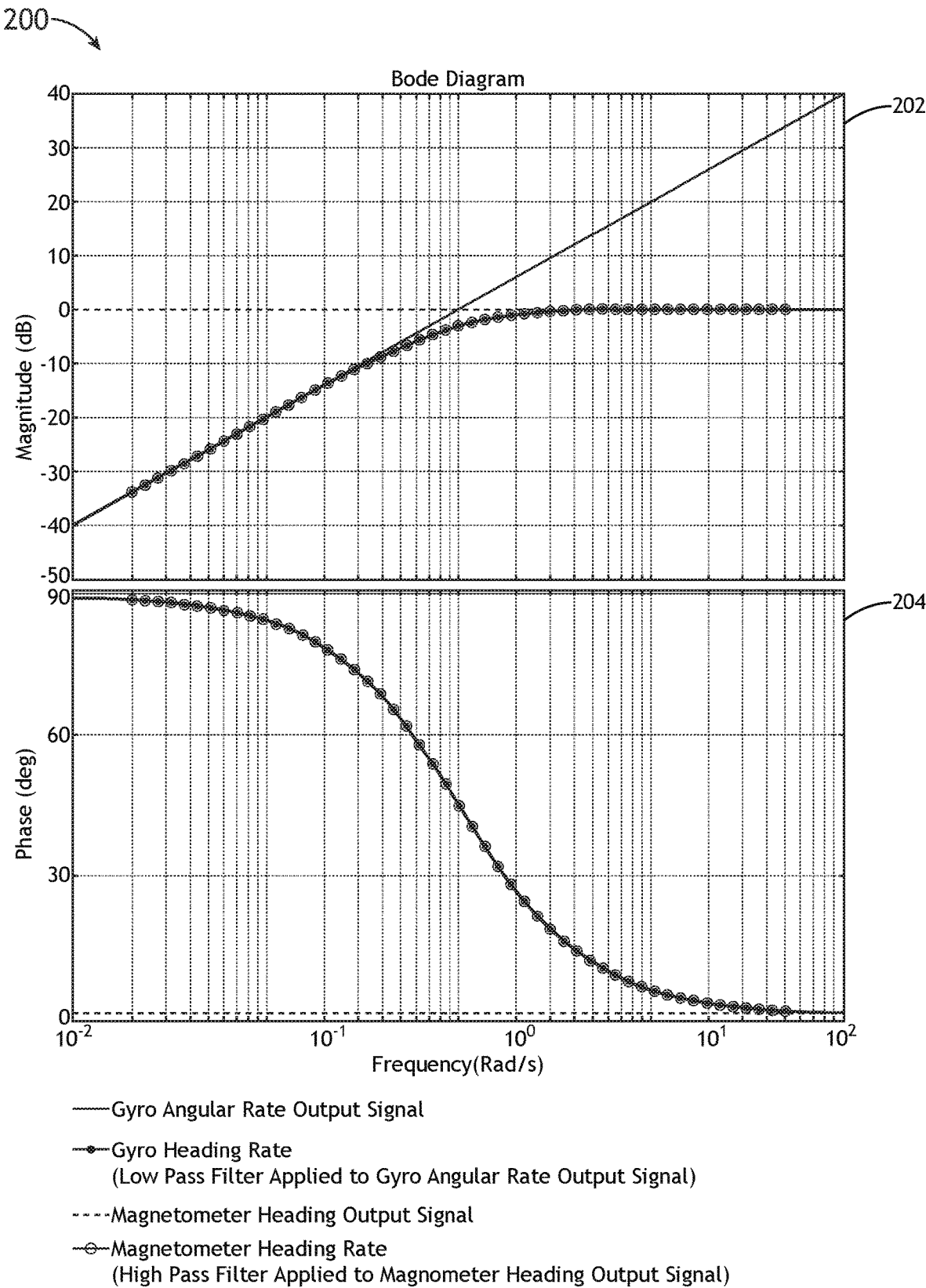
FIG. 2 depicts a bode diagram illustrating magnitude and phase responses of filters applied to a magnetic heading output signal and a gyro angular rate output signal, in accordance with an example embodiment of the present disclosure.
Figure 3:
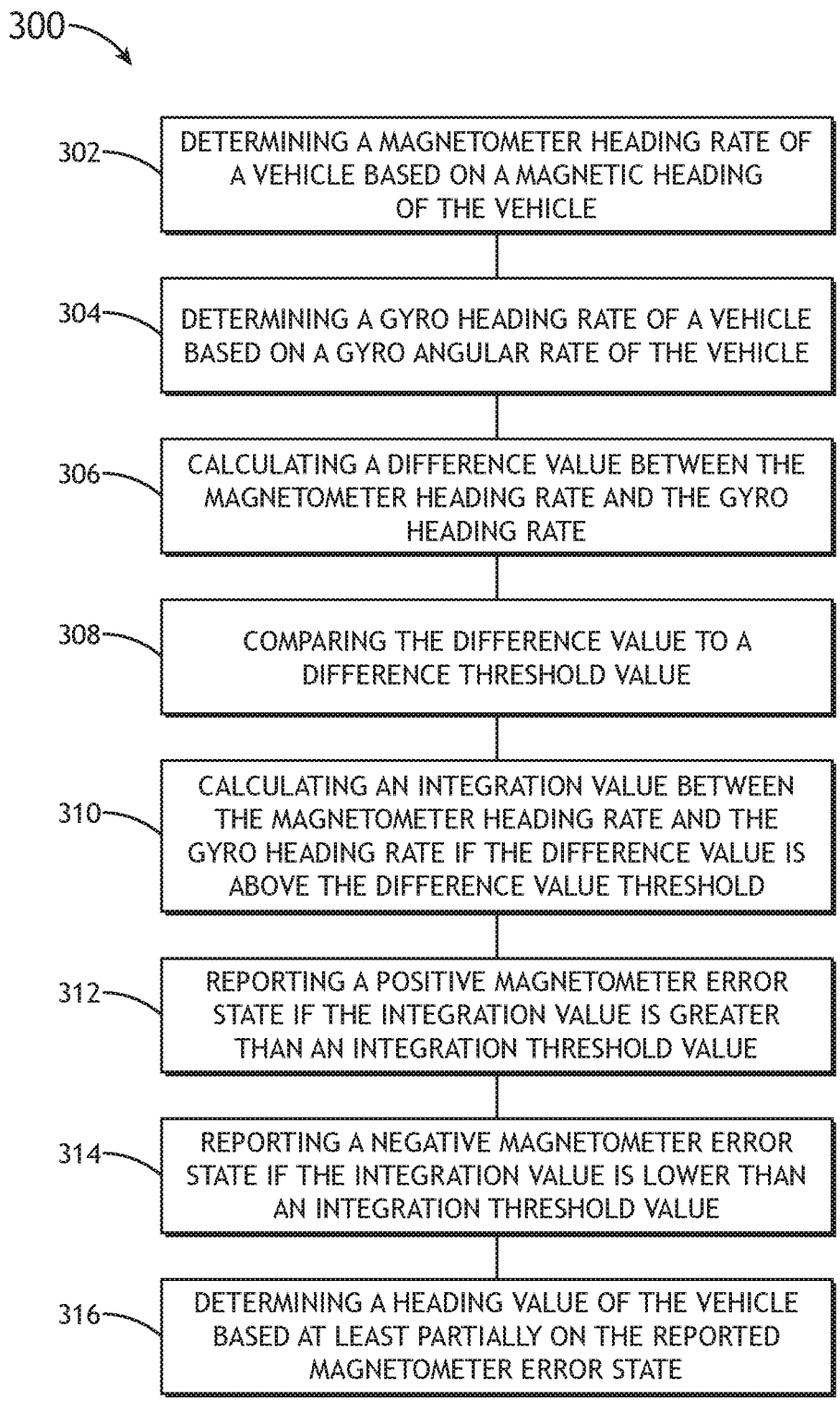
FIG. 3 illustrates a flowchart of a method for determining the heading of a vehicle, in accordance with an example embodiment of the present disclosure.

Referring generally to FIGS. 1-3, a system and method for monitoring magnetometer heading is described, in accordance with example embodiments of the present disclosure.

FIG. 1 illustrates a system 100 for determining the heading of a vehicle, in accordance with an example embodiment of the present disclosure. System 100 may include, but is not limited to, a vehicle navigation system 102, a user interface 114 including a display 116, and vehicle hardware 118.

In embodiments, system 100 may be implemented on a vehicle to monitor magnetometer heading calculations, and improve heading calculation accuracy. For example, system 100 may be implemented on an aircraft to improve heading calculation accuracy of the aircraft navigation system (e.g., aircraft navigation system 102). Although example embodiments of the present disclosure are shown and described in an avionics environment, the inventive concepts of the present disclosure may be configured to operate in any vehicle or other object known in the art. For example, the embodiments of the present disclosure may be incorporated into any air, land, or water-based vehicle, including personal equipment vehicles, commercial vehicles, military vehicles, and the like. In the interest of simplicity and to most clearly define the inventive concepts of the present disclosure, embodiments may be described throughout the present disclosure in an aircraft environment. However, these references are not to be regarded as limiting. Thus, references to "aircraft," "airplanes," "avionics," and like terms should not be interpreted as a limitation on the present disclosure, unless noted otherwise herein.

It is further noted herein that, where the environment includes an aircraft environment, it is noted herein the data transfer procedures within system 100 and method 300 may be configured in accordance with avionics guidelines and/or standards put forth by, but not limited to, the Federal Aviation Administration (FAA), the European Aviation Safety Agency (EASA) or any other flight certification agency or organization; the American National Standards Institute (ANSI), Aeronautical Radio, Incorporated (ARINC), or any other standards setting organization or company; the Radio Technical Commission for Aeronautics (RTCA) or any other guidelines agency or organization; or the like.

As shown in FIG. 1, the navigation system 102 of system 100 may include a magnetometer 104, one or more rate gyros 106, and a controller 108 including one or more processors 110 and a memory 112. The controller 108 and/or navigation system 102 may be communicatively coupled to a user interface 114 including a display 116.

In embodiments, the magnetometer 104 is configured to determine a magnetic heading of a vehicle. For example, in embodiments where system 100 is implemented in the context of an aircraft, the magnetometer 104 may be configured to determine a magnetic heading of the aircraft with respect to magnetic North. It is contemplated herein that the magnetometer 104 may be configured to collect magnetic heading readings on a regular, irregular, or intermittent basis. In this regard, the magnetometer 104 may be configured to collect magnetic heading readings at a pre-defined collection frequency. For example, the magnetometer 104 may be configured to determine the magnetic heading of the vehicle every second. By way of another example, the magnetometer 104 may be configured to determine the magnetic heading of the vehicle every 0.2 seconds.

The magnetometer 104 may be configured to generate a magnetic heading output signal, and transmit the magnetic heading output signal to the controller 108. The magnetic heading output signal may include a signal which reports the magnetic heading of the vehicle (e.g., aircraft) over time.

It is contemplated herein that the magnetometer 104 may be configured to determine the magnetic heading of a vehicle at varying rates depending upon a state of the vehicle. For example, at elevation, precise magnetic heading readings may not be required as frequently as when an aircraft is performing a landing procedure. In this regard, the magnetometer 104 may be configured to determine the magnetic heading and collect magnetic heading readings at varying collection rates depending on the stage of the flight. For instance, the magnetometer 104 may be configured to collect magnetic heading readings (e.g., determine a magnetic heading of the aircraft) every one second while the aircraft is at elevation, and may be further configured to collect magnetic heading readings every 0.2 second while the aircraft is preparing to land. It is contemplated herein that varying the rate at which the magnetometer 104 determines the magnetic heading of the vehicle may serve to conserve power, energy, and computational resources within system 100.

Similarly, in embodiments, the one or more rate gyros 106 are configured to determine gyro angular rate measurements of a vehicle. As noted previously with respect to the magnetometer 104, it is contemplated that the one or more rate gyros 106 may be configured to determine gyro angular rate measurements of the vehicle at any regular, irregular, or intermittent basis. It is contemplated that the one or more rate gyros 106 may be configured to determine gyro angular rate measurements of a vehicle at the same frequency with which the magnetometer 104 is configured to determine a magnetic heading of the vehicle. For example, in embodiments where the magnetometer 104 is configured to determine a magnetic heading of a vehicle at 50 Hz (e.g., every 0.2 seconds), the one or more rate gyros 106 may also be configured to determine gyro angular rate measurements of the vehicle at 50 Hz (e.g., every 0.2 seconds). It is further noted herein that the magnetometer 104 and the gyro 106 may be configured to determine magnetic heading measurements/angular rate measurements of the vehicle at identical points in time, such that a first magnetometer heading and a first gyro angular rate measurement are determined at a first time, a second magnetometer heading and a second gyro angular rate measurement are determined at a second time, and the like.

The one or more rate gyros 106 may be configured to generate a gyro angular rate output signal, and transmit the gyro angular rate output signal to the controller 108. The gyro angular rate output signal may include a signal which reports the angular rate of change of the heading of the vehicle (e.g., aircraft) over time. In particular, the gyro angular rate output signal may be regarded as the rate of change of gyro angular rate measurements with respect to a vertical axis relative to the Earth (e.g., vertical component of the gyro angular rate measurements). Accordingly, the gyro angular rate output signal provides a direct measurement of heading rate of change of the vehicle.

It is noted herein that rate measurements from multiple rate gyros 106 (or, alternatively, a triaxial rate gyro 106) may be combined to determine a total angular rate of heading change with respect to three axes: (1) a yaw axis (e.g., a vertical axis, (2) a roll axis, and (3) a pitch axis. For example, the one or more rate gyros 106 may include a rate gyro 106a configured to determine yaw rate of change measurements of the aircraft, a rate gyro 106b configured to determine pitch rate of change measurements of the aircraft, and a rate gyro 106c configured to determine roll rate of change measurements of the aircraft. The measurements from each rate gyro 106a, 106b, 106c may be combined in order to determine a total angular rate of the aircraft with respect to the three axes. In this regard, the gyro angular rate output signal, as it is used throughout the present disclosure, may be regarded as the rate of change of the gyro angular rate measurements with respect to the vertical axis (e.g., the gyro angular rate output signal is rate of change with respect to the yaw/vertical axis).

In embodiments, the controller 108 includes one or more processors 110 and a memory 112. In another embodiment, the controller 108 is communicatively coupled to the magnetometer 104 and the one or more rate gyros 106. Furthermore, the controller 108 may be configured to receive the magnetic heading output signal and the gyro angular rate output signal from the magnetometer 104 and the one or more rate gyros 106, respectively.

The one or more processors 110 of the controller 108 may be configured to execute a set of program instructions stored in memory 112, wherein the set of program instructions are configured to cause the one or more processors 110 to carry out the steps of the present disclosure. In embodiments, the one or more processors 110 may be configured to: receive the magnetic heading output signal and the gyro angular rate output signal; store output signal data in memory; determine a magnetometer heading rate of the magnetic heading output signal; determine a gyro heading rate based on the gyro angular rate output signal; calculate a difference value between the magnetometer heading rate and the gyro heading rate; compare the difference value to a difference threshold value; calculate a first integration value between the magnetometer heading rate and the gyro heading rate if the difference value is above the difference value threshold; report a positive magnetometer error state if the integration value is greater than an integration threshold value; report a negative magnetometer error state if the integration value is lower than the integration threshold value; determine a heading value of the vehicle based at least partially on the reported magnetometer error state; and generate one or more control signals configured to cause an actuator to adjust one or more vehicle hardware 118 characteristics in response to the determined heading value of the vehicle. Each of these steps will be described in turn.

In embodiments, the one or more processors 110 may be configured to receive the magnetic heading output signal and the gyro angular rate output signal and store the output signals in memory 112. The one or more processors 110 may be further configured to determine a magnetometer heading rate of the magnetic heading output signal. In embodiments, the magnetometer heading rate may be determined by applying a high-pass filter to the magnetic heading output signal. Similarly, the one or more processors 110 may be further configured to determine a gyro heading rate based on the gyro angular rate output signal. In embodiments, the gyro heading rate may be determined by applying a low-pass filter to the gyro angular rate output signal. In this regard, the magnetometer heading rate and the gyro heading rate may indicate the calculated rate of heading change over time. This may be further understood with reference to FIG. 2.

FIG. 2 depicts a bode diagram 200 illustrating magnitude and phase responses of filters applied to a magnetic heading output signal and a gyro angular rate output signal, in accordance with an example embodiment of the present disclosure. Bode diagram 200 includes a magnitude plot 202 and a phase plot 204. Magnitude plot 202 illustrates the magnitude (in dB) of the frequency response of the magnetometer heading rate and the gyro heading rate. Conversely, the phase plot 204 illustrates the phase shift (in degrees) of the magnetometer heading rate and the gyro heading rate.

It is noted herein that the magnetometer heading rate and the gyro heading rate should be equivalent if the same time constant is utilized for the high-pass filter and the low-pass filter used to calculate the heading rates. For example, as shown in the magnitude plot 202 of FIG. 2, a high-pass filter utilizing a first time constant is applied to the magnetometer heading output signal to obtain a magnetometer heading rate. Similarly, a low-pass filter utilizing a second time constant is applied to the gyro angular rate output signal to obtain a gyro heading rate. In this example, if the first time constant and the second time constant (e.g., the high-pass time constant and the low-pass time constant) are equal, the calculated magnetometer heading rate and the gyro heading rate are also equivalent, as may be seen in both the magnitude plot 202 and the phase plot 204.

Reference will again be made to FIG. 1. In embodiments, the one or more processors 110 may be configured to calculate a difference value between the magnetometer heading rate and the gyro heading rate. The difference value may be any metric indicative of a level of dissimilarity between the magnetometer heading rate and the gyro heading rate, and may thereby indicate discrepancies between the two. Accordingly, the difference value may be calculated using any mathematical technique known in the art. For example, difference value may be calculated by subtracting the gyro heading rate from the magnetometer heading rate. By way of another example, the difference value may be calculated by subtracting the magnetometer heading rate from the gyro heading rate. In this regard, the difference value may include the absolute value of the difference between the magnetometer heading rate and the gyro heading rate.

The one or more processors 110 may be further configured to compare the difference value to a difference threshold value. A pre-defined difference threshold value may be stored in memory 112. The difference threshold value may be manually and/or automatically adjusted based on any number of factors including, but not limited to, the phase of flight (e.g., takeoff, landing), margin for error, and the like. A difference value which is less than the difference threshold value may indicate an acceptable amount of magnetometer 104 error. Accordingly, a difference value which is less than the difference threshold value may indicate a "negative" magnetometer 104 error state, wherein the term "negative error state" indicates the magnetometer 104 is performing within an allowable accuracy/precision range.

Comparatively, if the difference value is above the difference threshold value, the one or more processors 110 may be configured to calculate an integration value between the magnetometer heading rate and the gyro heading rate. The integration value may represent a metric indicative of a level of dissimilarity between the magnetometer heading rate and the gyro heading rate over a particular time interval. The one or more processors 110 may be further configured to compare the integration value to a pre-defined integration threshold value. The integration threshold value may be stored in memory 112 and may be manually and/automatically adjusted based on any number of factors including, but not limited to, the phase of flight (e.g., takeoff, landing) margin for error, and the like.

In embodiments, the one or more processors 110 may be further configured to report a positive magnetometer error state if the integration value is greater than an integration threshold value. Conversely, the one or more processors 110 may be configured to report a negative magnetometer error state if the integration value is lower than the integration threshold value. The term "positive magnetometer error state" may be used to define a state where the magnetometer heading output signal is found to include a sufficient degree of error, where the term "negative magnetometer error state" may be used to define a state where the magnetometer heading output signal is found to include negligible and/or marginal error. In this regard, a "positive magnetometer error state" may indicate an unacceptable degree of magnetometer 104 heading error, wherein a "negative magnetometer error state" may indicate no error or an acceptable degree of magnetometer 104 heading error. The one or more processors 110 may be configured to report the magnetometer error state via the display 116 of the user interface 114.

During times in which the magnetometer and rate gyros agree (e.g., a negative magnetometer error state), the integration value may be washed out. Accordingly, the one or more processors 110 may be further configured to wash-out (e.g., reduce, zero-out, or the like) the integration value if the integration value is less than the integration threshold value. It is noted herein that washing-out (e.g., reducing, zeroing-out, or the like) the integration value when the processors 110 report a negative magnetometer error state (e.g., little or no magnetometer error) may be carried out to prevent a permanent reported magnetometer error state.

In additional embodiments, the one or more processors 110 may be configured to determine a heading value of the vehicle, wherein the heading value is indicative of the current heading of the vehicle. The one or more processors 110 may be further configured to report the heading value of the vehicle via the display 116 of the user interface 114. The heading value of the vehicle may be based at least partially on the reported magnetometer error state. More specifically, the one or more processors 110 may be configured to use or ignore the magnetometer heading output signal when determining a heading value of the vehicle based upon the reported magnetometer error state. In this regard, the heading value of the vehicle may be said to be based, at least partially, upon the reported magnetometer error state.

For example, when the one or more processors 110 report a positive magnetometer error state, the one or more processors 110 may be configured to ignore and/or disregard the magnetic heading output signal when determining the heading value of the vehicle. In this example, because the magnetometer has been identified to include a sufficient degree of error (e.g., positive magnetometer error state), the one or more processors 110 may ignore the magnetic heading output signal when determining the heading value of the vehicle, and may determine the heading value of the vehicle based solely on the gyro angular rate output signal. By way of another example, when the one or more processors 110 report a negative magnetometer error state, the one or more processors 110 may be configured to determine a heading value of the vehicle based at least on both the magnetic heading output signal and the gyro angular rate output signal.

It is noted herein that the one or more processors 110 may be configured to carry out the various calculations of the present disclosure continuously, intermittently, or at regular and/or irregular intervals. In this regard, the one or more processors 110 may be configured to continuously, intermittently, and/or regularly update and report a magnetometer error state. For example, the one or more processors 110 may calculate a first integration value between the magnetometer heading rate and the gyro heading rate over a first time interval. The one or more processors 110 may then compare the first integration value to an integration threshold value, determine that the first integration value is greater than the integration threshold value, and report a positive magnetometer error state for the first time interval. Subsequently, the one or more processors may calculate a second integration value rate over a second time interval. The one or more processors 110 may then compare the second integration value to the integration threshold value, determine that the second integration value is lower than the integration threshold value, and report a negative magnetometer error state for the second time interval.

It is noted herein that continually updating and reporting a magnetometer error state may prevent system 100 from identifying and reporting a single, permanent positive magnetometer error state. Furthermore, by continually updating and reporting a magnetometer error state, the one or more processors 110 may be configured to determine in real or near-real time when the magnetometer 104 is sufficiently accurate/precise to be considered in determining a heading value of the vehicle.

In embodiments, the one or more processors 110 of the controller 108 are configured to generate one or more control signals configured to cause an actuator to adjust one or more vehicle hardware 118 characteristics in response to the determined heading value of the vehicle. The actuator may adjust any vehicle hardware 118 characteristics known in the art for adjusting the speed, heading, or orientation of the vehicle.

It is noted herein that the one or more components of system 100 may be communicatively coupled to the various other components of system 100 in any manner known in the art. For example, the one or more processors 110 may be communicatively coupled to each other and other components via a wireline (e.g., copper wire, fiber optic cable, and the like) or wireless connection (e.g., RF coupling, IR coupling, data network communication (e.g., 3G, 4G, LTE, 5G, WiFi, WiMax, Bluetooth and the like).

In one embodiment, the one or more processors 110 may include any one or more processing elements known in the art. In this sense, the one or more processors 110 may include any microprocessor-type device configured to execute software algorithms and/or instructions. In one embodiment, the one or more processors 110 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 110. In general, the term "processor" may be broadly defined to encompass any device having one or more processing elements, which execute program instructions from memory 112.

Moreover, different subsystems of the system 100 (e.g., magnetometer 104, one or more rate gyros 106, user interface 114, vehicle hardware 118) may include processor or logic elements suitable for carrying out at least a portion of the steps described throughout the present disclosure. Therefore, the above description should not be interpreted as a limitation on the present disclosure but merely an illustration. For example, in an additional and/or alternative embodiment, a "magnetometer error state sub-system" may include the magnetometer 104, the one or more rate gyros 106, and a controller including one or more processors and memory. The magnetometer error state sub-system may be configured to carry out various steps of the present disclosure to determine and report a magnetometer error state. The magnetometer error state sub-system may be further configured to transmit the reported magnetometer error state to a "vehicle navigation sub-system," which includes an additional controller including one or more processors and memory. The vehicle navigation sub-system may be configured to carry out navigation functions of the vehicle, including determining and adjusting the heading of the vehicle. In this regard, the vehicle navigation sub-system may be configured to receive the reported magnetometer error state from the magnetometer error state sub-system and determine a heading value of the vehicle (e.g., use or not use the magnetometer heading output signal based on the reported magnetometer error state).

The memory 112 may include any storage medium known in the art suitable for storing program instructions executable by the associated one or more processors 110 and the data received from the magnetometer 104 and one or more rate gyros 106. For example, the memory 112 may include a non-transitory memory medium. For instance, the memory 112 may include, but is not limited to, a read-only memory (ROM), a random access memory (RAM), a magnetic or optical memory device (e.g., disk), a magnetic tape, a solid state drive and the like. It is further noted that memory 112 may be housed in a common controller housing with the one or more processors 110. In an alternative embodiment, the memory 112 may be located remotely with respect to the physical location of the processors 110, controller 108, and the like. In another embodiment, the memory 112 maintains program instructions for causing the one or more processors 110 to carry out the various steps described through the present disclosure.

In one embodiment, the user interface 114 may include, but is not limited to, one or more desktops, tablets, smartphones, smart watches, or the like. In another embodiment, the user interface 114 includes a display 116 used to display data of the system 100 to a user. The display 116 of the user interface 114 may include any display known in the art. For example, the display 116 may include, but is not limited to, a liquid crystal display (LCD), an organic light-emitting diode (OLED) based display, or a CRT display. Those skilled in the art should recognize that any display device capable of integration with a user interface 114 is suitable for implementation in the present disclosure. In another embodiment, a user may input selections and/or instructions responsive to data displayed to the user via the user interface 114.

FIG. 3 illustrates a flowchart of a method 300 for determining the heading of a vehicle, in accordance with an example embodiment of the present disclosure. It is noted herein that the steps of method 300 may be implemented all or in part by system 100. It is further recognized, however, that the method 300 is not limited to the system 100 in that additional or alternative system-level embodiments may carry out all or part of the steps of method 300.

In a step 302, a magnetic heading rate of a vehicle is determined based on a magnetic heading of the vehicle. For example, a magnetometer 104 may generate and transmit a magnetometer heading output signal to the controller 108. The one or more processors 110 of the controller 108 may then be configured to determine a magnetic heading rate by applying a high-pass filter to the magnetic heading output signal.

In a step 304, a gyro heading rate of a vehicle is determined based on a gyro angular rate of the vehicle. For example, one or more rate gyros 106 may generate and transmit a gyro angular rate output signal to the controller 108. The one or more processors 110 of the controller 108 may then be configured to determine a gyro heading rate by applying a low-pass filter to the gyro angular rate output signal. As noted previously herein, the same time constant may be used for both the high-pass filter and the low-pass filter.

In a step 306, a difference value between the magnetometer heading rate and the gyro heading rate is calculated. The difference value may be any metric indicative of a level of dissimilarity between the magnetometer heading rate and the gyro heading rate, and may thereby indicate discrepancies between the two. For example, difference value may be calculated by as the absolute value of the difference between the gyro heading rate and the magnetometer heading rate.

In a step 308, the difference value is compared to a threshold value. A difference value which is less than the difference threshold value may indicate an acceptable amount of magnetometer 104 error. Accordingly, a difference value which is less than the difference threshold value may indicate a "negative" magnetometer 104 error state, wherein the term "negative error state" indicates the magnetometer 104 is performing within an allowable accuracy/precision range.

In a step 310, an integration value is calculated between the magnetometer heading rate and the gyro heading rate if the difference value is above the difference threshold. The integration value may represent a metric indicative of a level of dissimilarity between the magnetometer heading rate and the gyro heading rate over a particular time interval. The one or more processors 110 may be further configured to wash-out (e.g., reduce, zero-out, or the like) the integration value if the integration value is less than the integration threshold value.

In a step 312, a positive magnetometer error state is reported if the integration value is greater than an integration threshold value. In a step 314, a negative magnetometer error state is reported if the integration value is lower than the integration threshold value.

In a step 316, a heading value of the vehicle is determined based at least partially on the reported magnetometer error state. For example, when the one or more processors 110 report a positive magnetometer error state, the one or more processors 110 may be configured to ignore or disregard the magnetometer heading output signal when determining the heading value of the vehicle. In this example, because the magnetometer has been identified to include a sufficient degree of error (e.g., positive magnetometer error state), the processors 110 may ignore the magnetometer heading output signal when determining the heading value of the vehicle, and may determine the heading value of the vehicle based solely on the gyro angular rate output signal. By way of another example, when the one or more processors 110 report a negative magnetometer error state, the one or more processors 110 may be configured to determine a heading value of the vehicle based at least on both the magnetometer heading output signal and the gyro angular rate output signal.

In embodiments, controller 108 is configured to use a Kalman filter to determine comprehensive vehicle states, including vehicle heading, vehicle pitch, vehicle roll, velocity, position, biases on sensors, and the like. For example, the controller 108 may be configured to propagate heading (e.g., determine a heading value) of the vehicle based upon gyro angular rate measurements, while heading correction updates are provided by other sensors, including a magnetometer. In this example, when the system 100 reports a positive magnetometer error state, the controller 108 may be configured to use a Kalman filter which ignores magnetometer heading measurements and determines a heading value of the vehicle based at least on the gyro angular rate measurements. Conversely, when the system 100 reports a negative magnetometer error state, the controller 108 may be configured to use a Kalman filter which determines a heading value of the vehicle based upon the magnetometer heading measurements and the gyro angular rate measurements.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed is:

1. A system, comprising:
    a magnetometer configured to determine a magnetic heading of a vehicle and generate a magnetic heading output signal;
    one or more rate gyros configured to generate a gyro angular rate output signal; and
    a controller configured to:
        determine a magnetometer heading rate over a time interval based on the magnetic heading output signal;
        determine a gyro heading rate over the time interval based on the gyro angular rate output signal;
        calculate a difference value between the magnetometer heading rate and the gyro heading rate over the time interval and compare the difference value to a difference threshold value;
        calculate an integration value between the magnetometer heading rate and the gyro heading rate over the time interval if the difference value is above the difference threshold value; and
        report a positive magnetometer error state if the integration value is greater than an integration threshold value, and report a negative magnetometer error state if the integration value is lower than the integration threshold value, wherein the magnetometer heading rate is determined by applying a high-pass filter with a high-pass time constant to the magnetic heading output signal, wherein the gyro heading rate is determined by applying a low-pass filter with a low-pass time constant to the gyro angular rate output signal, wherein the high-pass time constant and the low-pass time constant are equal, wherein a length of the time interval is variable and automatically adjustable dependent upon a phase of flight, wherein the time interval is one second at an elevation phase of flight and is 0.2 seconds at a landing phase of flight, wherein the difference value threshold is variable and automatically adjustable dependent upon the phase of flight, wherein the difference value threshold at the elevation phase of flight is greater than the difference value threshold at the landing phase of flight.

2. The system of claim 1, wherein the controller is further configured to:
   determine a magnetometer heading rate over an additional time interval based on the magnetic heading output signal;
   determine a gyro heading rate over the additional time interval based on the gyro angular rate output signal;
   calculate an additional difference value between the magnetometer heading rate and the gyro heading rate over the additional time interval and compare the additional difference value to the difference threshold value;
   calculate an additional integration value between the magnetometer heading rate and the gyro heading rate over the additional time interval if the difference value is above the difference threshold value; and
   report a positive magnetometer error state if the additional integration value is greater than the integration threshold value, and report a negative magnetometer error state if the additional integration value is lower than the integration threshold value.

3. The system of claim 1, wherein the controller is further configured to:
   determine a heading value of the vehicle based at least partially on the reported magnetometer error state.

4. The system of claim 3, wherein the controller is configured to determine the heading value of the vehicle based on a combination of the magnetic heading output signal and the gyro angular rate output signal to when the controller reports a negative magnetometer error state.

5. The system of claim 3, wherein the controller is configured to exclude the magnetic heading output signal when determining the heading value of the vehicle when the controller reports a positive magnetometer error state.

6. The system of claim 3, wherein the controller is further configured to generate one or more control signals configured to cause an actuator to adjust one or more vehicle hardware characteristics in response to the determined heading value of the vehicle.

7. The system of claim 3, further comprising a user interface configured to report the heading value of the vehicle.

8. The system of claim 1, wherein the vehicle comprises an aircraft.

9. The system of claim 1, wherein the controller is configured to determine a magnetometer heading rate over an additional time interval based on the magnetic heading output signal employing a Kalman filter.

10. A vehicle system, comprising:
    a navigation system controller configured to:
      determine a magnetometer heading rate of the aircraft based on a magnetic heading output signal;
      determine a gyro heading rate of the aircraft based on a gyro angular rate output signal;
      calculate a difference value between the magnetometer heading rate and the gyro heading rate and compare the difference value to a difference threshold value;
      calculate an integration value between the magnetometer heading rate and the gyro heading rate if the difference value is above the difference threshold value; and
      report a positive magnetometer error state if the integration value is greater than an integration threshold value, and report a negative magnetometer error state if the integration value is lower than the integration threshold value, wherein the magnetometer heading rate is determined by applying a high-pass filter with a high-pass time constant to the magnetic heading output signal, wherein the gyro heading rate is determined by applying a low-pass filter with a low-pass time constant to the gyro angular rate output signal, wherein the high-pass time constant and the low-pass time constant are equal, wherein a length of the time interval is variable and automatically adjustable dependent upon a phase of flight, wherein the time interval is one second at an elevation phase of flight and is 0.2 seconds at a landing phase of flight, wherein the difference value threshold is variable and automatically adjustable dependent upon the phase of flight, wherein the difference value threshold at the elevation phase of flight is greater than the difference value threshold at the landing phase of flight, wherein the controller is further configured to determine a heading value of the vehicle based at least partially on the reported magnetometer state and generate one or more control signals configured to adjust one or more actuators that adjust speed or orientation of the vehicle.

11. The system of claim 10, wherein the controller is further configured to determine a heading value of the vehicle based on a combination of the magnetic heading output signal and the gyro angular rate output signal when the controller reports a negative magnetometer error state.

12. The system of claim 10, wherein the controller is further configured to exclude the magnetic heading output signal when determining a heading value of the when the controller reports a positive magnetometer error state.

13. The system of claim 10, wherein the vehicle comprises an aircraft.

14. The system of claim 10, wherein the controller is configured to determine a magnetometer heading rate over an additional time interval based on the magnetic heading output signal employing a Kalman filter.

15. A method for determining a heading of a vehicle, comprising:
    determining a magnetometer heading rate of a vehicle based on a magnetic heading output signal of the vehicle;
    determining a gyro heading rate of the vehicle based on a gyro angular rate output signal of the vehicle;
    calculating a difference value between the magnetometer heading rate and the gyro heading rate;
    comparing the difference value to a difference threshold value;
    calculating an integration value between the magnetometer heading rate and the gyro heading rate if the difference value is above the difference threshold value;
    reporting a positive magnetometer error state if the integration value is greater than an integration threshold value; and
    reporting a negative magnetometer error state if the integration value is lower than the integration threshold value, wherein the magnetometer heading rate is determined by applying a high-pass filter with a high-pass time constant to the magnetic heading output signal, wherein the gyro heading rate is determined by applying a low-pass filter with a low-pass time constant to the gyro angular rate output signal, wherein the high-pass time constant and the low-pass time constant are equal, wherein a length of the time interval is variable and automatically adjustable dependent upon a phase of flight, wherein the time interval is one second at an elevation phase of flight and is 0.2 seconds at a landing phase of flight, wherein the difference value threshold is variable and automatically adjustable dependent upon the phase of flight, wherein the difference value threshold at the elevation phase of flight is greater than the difference value threshold at the landing phase of flight.

16. The method of claim 15, determining a magnetometer heading rate of a vehicle based on a magnetic heading output signal of the vehicle includes using a Kalman filter.

\* \* \* \* \*